United States Patent [19]

Tornare

[11] Patent Number: 5,611,624
[45] Date of Patent: Mar. 18, 1997

[54] DEVICE AND METHOD FOR DIGITALLY MEASURING A VOLTAGE VARYING WITHIN A GIVEN RANGE, AND USES THEREOF

[75] Inventor: Jean-Marc Tornare, Toulouse, France

[73] Assignee: Siemens Aktiengesellschaft, Munich, Germany

[21] Appl. No.: 448,550

[22] PCT Filed: Feb. 2, 1994

[86] PCT No.: PCT/EP94/00297

§ 371 Date: Jun. 7, 1995

§ 102(e) Date: Jun. 7, 1995

[87] PCT Pub. No.: WO94/18445

PCT Pub. Date: Aug. 18, 1994

[30] Foreign Application Priority Data

Feb. 10, 1993 [FR] France ................................. 93 01468

[51] Int. Cl.⁶ ............................. G01K 7/02; F02D 41/24
[52] U.S. Cl. ........................ 374/179; 374/142; 364/557; 364/431.03
[58] Field of Search ..................................... 374/179, 142, 374/183; 324/71.1, 99 D; 364/557, 431.03

[56] References Cited

U.S. PATENT DOCUMENTS

| | | | |
|---|---|---|---|
| 3,826,983 | 7/1974 | Garratt et al. ........................ | 324/99 D |
| 4,211,113 | 7/1980 | Harrison ................................. | 374/179 |
| 4,223,549 | 9/1980 | Kitzinger ................................ | 374/142 |
| 4,924,399 | 5/1990 | Kaiser et al. .......................... | 123/417 |

FOREIGN PATENT DOCUMENTS

| | | |
|---|---|---|
| 0492989 | 7/1992 | European Pat. Off. . |
| 0503882 | 9/1992 | European Pat. Off. . |
| 2615017 | 11/1988 | France . |
| 4106308 | 9/1992 | Germany . |

*Primary Examiner*—Christopher W. Fulton
*Attorney, Agent, or Firm*—Herbert L. Lerner; Laurence A. Greenberg

[57] ABSTRACT

A method wherein (a) a voltage to be measured ($U_e$) is amplified with a gain proportional to the ratio between the reference voltage ($V_{ref}$) of an analogue-to-digital converter (3) and the extent of the voltage range; (b) the reference voltage ($V_{ref}$) is amplified with a gain proportional to the ratio between the lower terminal ($U_1$) of the voltage range and the extent of the voltage range; and (c) the analogue input of the converter (3) is supplied with the resulting amplified voltage difference. The method is useful for measuring a temperature by means of a thermocouple and measuring the temperature of an oxygen sensor in a motor vehicle exhaust line.

9 Claims, 1 Drawing Sheet

DEVICE AND METHOD FOR DIGITALLY MEASURING A VOLTAGE VARYING WITHIN A GIVEN RANGE, AND USES THEREOF

BACKGROUND OF THE INVENTION

Field of the Invention

The present invention relates to a method and a device for digitally measuring an analog voltage that varies over a predetermined voltage range, and more particularly to the use of such a device for measuring a temperature.

In automotive electronics, it is often necessary to measure the temperature of certain fluids, oil or coolant, or devices such as a catalytic converter for oxide reduction of the exhaust gases from a motor vehicle, or an oxygen sensor used in a device for regulating the air and fuel mixture supplied to the engine of such a vehicle. Currently, a suitable temperature pickup furnishes an analog electrical signal to an analog/digital converter, which furnishes a digital expression of the temperature measurement that can be used by a computer that forms part of an open- or closed-loop control unit provided in the vehicle.

The signal output by the pickup is normally an electrical voltage. When the temperature monitored becomes the subject of closed-loop control, this control keeps the signal within a predetermined voltage range. Thus oxygen sensors are known that are associated with a heating resistor actuated in such a way as to maintain the sensor temperature within a very narrow temperature range, for example 650° to 750° C., in which range the signal output by the sensor can be used. If the sensor temperature is evaluated on the basis of the temperature of the heating resistor, whose resistance is a function of that temperature, then the voltage picked up at its terminals to do so also varies within a range whose values are fixed by the limits of the aforementioned temperature range.

It has also been desirable for the temperature of the catalytic converter, around an optimal operating temperature of 850° C., for example, to be known by a computer with a fixed precision of several percent. If a thermocouple is used to do so, then its output voltage varies in a corresponding manner within a predetermined voltage range.

The problem then arises of the precision of the digital measurement of the image voltage of the temperature observed. This precision is a function of the reference voltage $V_{ref}$ of the converter and of the number of bits n of the measurement N that it furnishes. In the aforementioned applications, measuring the voltage is of interest only within a predetermined voltage range, which a priori does not correspond to the dynamics of the digital measurement chain used, which depends on parameters ($V_{ref}$, n) that are independent of this range.

SUMMARY OF THE INVENTION

Accordingly, the object of the present invention is to furnish a method of digital measurement of a voltage that varies within a predetermined range, with the aid of a measurement chain including an analog/digital converter, with which method a maximum measurement precision within this range can be attained.

Another object of the present invention is to furnish such a method that is suitable for measuring an analog voltage affected by the voltage furnished by an electrical power source, which may possibly fluctuate, as is the case of the voltage furnished by the battery of a motor vehicle, by which method a digital measurement freed of any influence of the fluctuations of the voltage can be obtained.

Furthermore, an object of the invention is to use a device for implementing this method that can be used particularly in a temperature measurement chain.

These objects of the invention as well as others that will become apparent in the ensuing description, are attained with a method by which a) the voltage to be measured is amplified with a gain proportional to the ratio between the reference voltage of the analog/digital converter used and the length of said voltage range;

b) the reference voltage is amplified with a gain proportional to the ratio between the lower value of the voltage range to the breadth of this voltage range; and c) the analog input of the converter is supplied with the difference between the thus-amplified voltages.

As will be noted in further detail hereinafter, this method makes it possible to adapt the converter dynamics to the length of the voltage range, so as to advantageously maximize the precision of the measurement furnished by the converter.

In a variant of the method according to the invention, adapted for measuring an analog voltage affected by the voltage furnished by a possibly fluctuating electrical supply source, the converter is supplied with a reference voltage proportional to the fluctuating electrical voltage, in such a way as to make the digital measurement furnished by the converter independent of the fluctuations in said voltage.

This variant is especially useful in motor vehicle electronics, because as is well known, the source of electrical voltage normally used there is the vehicle battery, whose output voltage currently exhibits very major fluctuations, for example from 4 to 15 V for a nominal voltage of 12 V.

For implementing this method, the invention furnishes a device, including an analog/digital converter and a source of reference voltage ($V_{ref}$) for supply to this converter; this device is notable in that it includes amplification means supplied with the analog voltage ($U_e$) to be measured and with the reference voltage ($V_{ref}$) in order to furnish to the analog input of the converter an output voltage ($U_s$) such that:

$$U_s = \frac{V_{ref}}{U_2 - U_1} \cdot U_e - \frac{U_1}{U_2 - U_1} \cdot V_{ref}$$

where $U_1$ and $U_2$, respectively, are the lower and upper values of the predetermined voltage range.

Further characteristics and advantages of the present invention will become more apparent from the ensuing description and from a study of the accompanying drawing, in which:

DESCRIPTION OF THE PREFERRED EMBODIMENT

Figure 1:
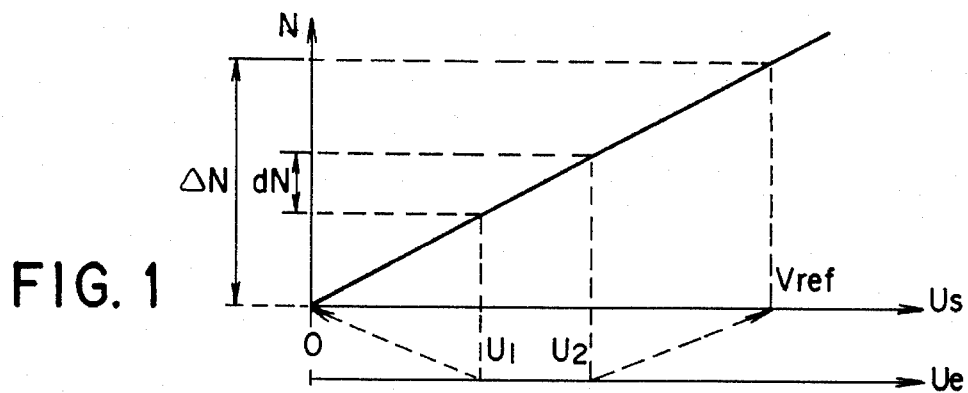
FIG. 1 is a graph useful for illustrating the method of the present invention.

On the $U_e$ axis of FIG. 1, a predetermined voltage range ($U_1$, $U_2$), within which a voltage $U_e$ to be measured varies, is plotted. Also shown in FIG. 1, on the other axis, is the graph of the output N of an analog/digital converter supplied with a reference voltage $V_{ref}$.

If $U_1 < U_2 < V_{ref}$, then one can see that the range of variation $dN$ of the output of the analog/digital converter corresponding to the range ($U_1$, $U_2$) is much narrower than the dynamics $\Delta N$ of the converter, at the expense of the precision of the digital measurement of the voltage to be measured, whose resolution is proportional to the reference voltage $V_{ref}$ and inversely proportional to $2^n$, where n is the number of bits of the output of the converter.

In the present invention, the precision of the voltage measurement to be made is maximized by adapting the voltage range [0, $V_{ref}$] of the converter to the voltage range [$U_1$, $U_2$]. To do so, the voltage $U_1$ is made to correspond to 0 in the range to be measured of the converter, and the voltage $U_2$ is made to correspond to the voltage $V_{ref}$. This measurement range is then graduated over the totality of the $2^n$ levels of the output N of the converter, not over a fraction of these $2^n$ levels, which thus improves the precision of measurement of a voltage $U_e$ that is within this measurement range. A computer, supplied with the output of the converter and loaded with the voltage value $U_1$ corresponding to the 0 of the converter output, thus establishes the voltage $U_e$ with the greatest possible precision, taking into account the characteristics of the analog/digital converter used.

Figure 2:
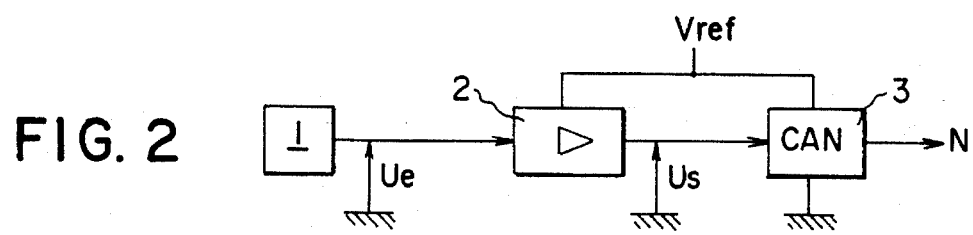
FIG. 2 is a functional diagram of a device for implementing the method of the present invention.

Turning to FIG. 2 of the accompanying drawing, a device will be described that is designed for the implementation of the present invention. A pickup 1 furnishing a voltage signal $U_e$ to be measured is connected to amplification means 2, whose output $U_s$ supplies an analog/digital converter 3, which in turn is supplied with a reference voltage $V_{ref}$.

According to the present invention, the amplification means 2 are further supplied by the reference voltage $V_{ref}$ and furnish an output voltage $U_s$ such that:

$$U_s = K \cdot U_e - K' \cdot V_{ref} \quad (1)$$

where K and K' are constants established as follows.

According to the invention, the voltage $U_1$ and $U_2$ correspond respectively to the voltages 0 and $V_{ref}$ at the output of the amplification means 2, and hence by employing the equation (1) above:

$$0 = K \cdot U_1 - K' \cdot V_{ref}$$

$$V_{ref} = K \cdot U_2 - K' \cdot V_{ref}$$

The following relationships can be found:

$$K = \frac{V_{ref}}{U_2 - U_1}$$

$$K' = \frac{U_1}{U_2 - U_1}$$

The relationship (1) is then expressed as follows:

$$U_s = \frac{V_{ref}}{U_2 - U_1} \cdot U_e - \frac{U_1}{U_2 - U_1} \cdot V_{ref} \quad (2)$$

Thus by amplifying the voltages $U_e$ and $V_{ref}$ in the means 2 with the amplification gains K and K', which are calculated as indicated above, and by supplying the analog input of the converter 3 with the difference $U_s$ between these amplified voltages, a measurement of the voltage $U_e$ whose precision is as high as possible can be taken from the output N of the converter and from a recorded digital measurement of the voltage $U_1$; the pitch of this precise measurement of the voltage $U_e$ is equal to $V_{ref}/2^n$, where n is the number of bits of the output N of the converter 3. Thanks to the amplification means 2, an output N=0 of the converter 3 corresponds to an input voltage $U_e = U_1$, and $N = 2^n$ corresponds to a voltage $U_e = U_2$.

Figure 3:
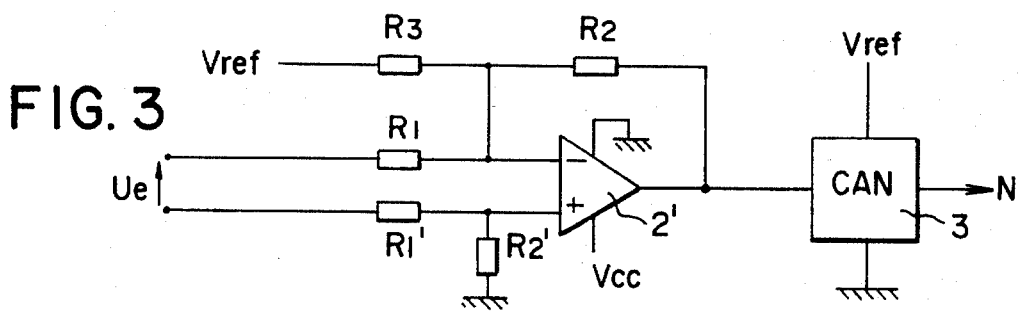
FIG. 3 illustrated one embodiment of the device schematically shown in FIG. 2.

One embodiment of the device schematically shown in FIG. 2 has been shown in FIG. 3 of the accompanying drawing. The amplification means comprise a differential amplifier 2', supplied on the one hand with the voltage $U_e$ to be measured, via charge resistors $R_1$ and $R'_1$, between its inverting and noninverting inputs, respectively, and on the other is supplied with an offset voltage as a function of the reference voltage $V_{ref}$ of the converter. A reaction resistor $R_2$ is mounted between the output of the amplifier and the inverting input, in order in combination with the resistor $R_1$ to establish the gain of the amplifier relative to the input voltage $U_e$, while the reference voltage $V_{ref}$ of the converter is connected to one terminal of a resistor $R_3$, whose other terminal, which is in common with the resistor $R_2$, is connected to the inverting input of the amplifier. The noninverting input is connected to ground through a resistor $R'_2$. Under these conditions, it can be demonstrated that the relationship (2) above becomes as follows:

$$U_s = \frac{R_2}{R_1} \cdot U_e - \frac{R_2}{R_3} \cdot V_{ref}$$

where $$R_2' = \frac{R_2 \cdot R_3}{R_2 + R_3} \quad et \; R_1 = R_1'$$

Figure 4:
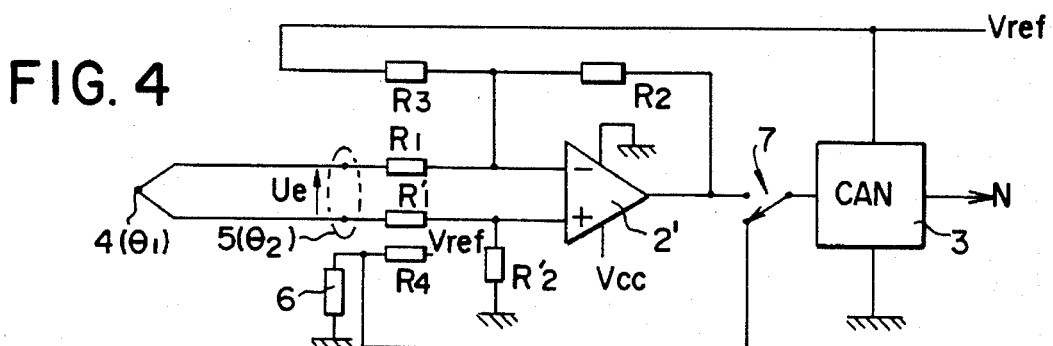
FIG. 4 is a diagram of a device for measuring a temperature with the aid of a thermocouple, implementing the method of the invention.

A first use of the invention, for measuring a voltage that varies within a predetermined range furnished by a thermocouple, is illustrated in FIG. 4. The measurement chain represented includes a thermocouple whose "hot" junction 4 is at a temperature $\Theta_1$ to be measured, while its reference junction 5 is at a temperature $\Theta_2$. It is known that such a thermocouple furnishes a voltage as follows:

$$U_e = f(\Theta_1 - \Theta_2)$$

The voltage $U_e$ supplies a device that is identical to that of FIG. 3. The same reference numeral is used for devices or elements that are identical or similar in FIGS. 3–5. It is understood that a computer can determine the voltage of the temperature $\Theta_1$ from the function f and from a measurement of the voltage $U_e$, with the temperature of $\Theta_2$ being assumed to be fixed and known.

When the temperature $\Theta_2$ the reference junction is likely to vary (as is the case for example when it is at ambient temperature), then according to the invention means are provided that are sensitive to the temperature of this junction and are capable of furnishing a correction signal, enabling the computer to suitably correct the calculation of the temperature $\Theta_1$.

To do so, a temperature pickup, such as a thermistor 6, is disposed in proximity with the reference junction 5, and the variations in the resistance of the thermistor 6 cause the voltage at the middle point of a resistor bridge ($R_{4,6}$), which is supplied with the voltage $V_{ref}$ for example, to vary. The computer periodically orders a switching means 7 to connect the middle point of the bridge to the input of the converter 3, which then furnishes the computer with a digital measurement of the temperature $\Theta_2$. Such a device is useful especially when a temperature sensor must be located at a distance far from the computer, as is the case for instance when the temperature of a catalytic converter for oxide reduction of the exhaust gases from an internal combustion motor driving a motor vehicle is measured.

Figure 5:
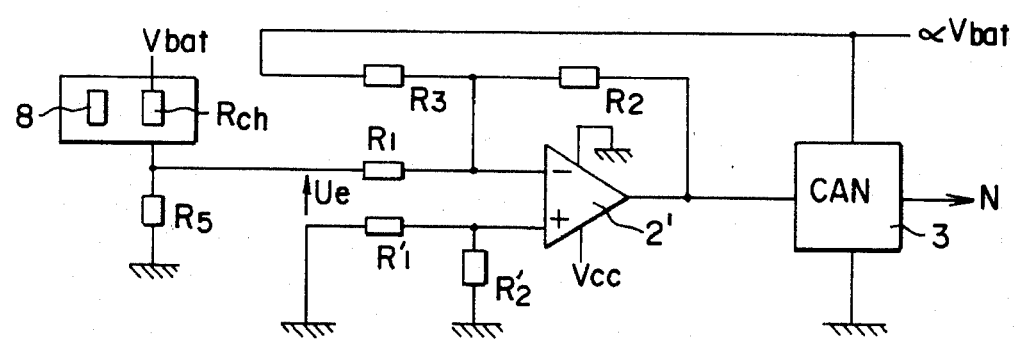
FIG. 5 is a diagram of a device for measuring the temperature of an oxygen sensor, corresponding to another use of the method of the invention.

Another "motor vehicle" use of the present invention is shown in FIG. 5. This is the measurement of the temperature of an oxygen sensor 8 heated by a heating resistor $R_{ch}$. As has been seen above, the temperature of such a sensor must be kept within a relatively narrow range. To that end, a device for closed-loop control of this temperature controls the supply to the heating resistor. This resistor may be considered in thermal equilibrium with the sensor 8 that it heats. The temperature of the sensor can be known from that of the heating resistor assumed to be in thermal equilibrium with the sensor, which resistor varies with the temperature, as is well known. This measurement is made by picking up the voltage $U_e$ from the middle point of a bridge comprising the resistor $R_{ch}$ and a fixed resistor $R_5$, the resistors being connected in series between the positive pole of the vehicle battery and ground. This voltage varies inversely with the variation in the resistance of $R_{ch}$, when this resistor has a positive temperature coefficient, as is conventionally the case. The measurement of this voltage by a computer supplied with the output of the converter 3 of a device that is also in accordance with those shown in FIGS. 3 and 4 accordingly makes it possible to arrive at the temperature of the sensor 8.

In a motor vehicle, the voltage $+V_{bat}$ furnished by the battery is capable of very major fluctuation, as has been seen above. Such fluctuations accordingly adulterate the measurement made, since they affect the supply to the heating resistor.

This disadvantage is overcome, according to the present invention, by taking the reference voltage $V_{ref}$ of the converter from the voltage $+V_{bat}$ furnished by the battery, in such a way that these voltages vary in the same direction. Automatic compensation for the effects of fluctuation in the battery voltage is thus obtained. Since the battery voltage is generally higher than the maximum voltage that the converter can withstand at its reference voltage terminal, it is only a fraction $\alpha V_{bat}$ ($\alpha<1$) of the output voltage of the battery that supplies the device according to the invention. It is understood that the present invention is not limited to the embodiments described and shown, which are given solely by way of example. The invention is accordingly advantageously applicable as well to the digital measurement of any variable that is accessible by means of a voltage varying within a predetermined range, and not only to measuring a temperature.

I claim:

1. A method of digitally measuring an analog voltage which varies within a predetermined voltage range defined between a lower voltage and an upper voltage, the method which comprises:

supplying an analog/digital converter with a reference voltage;

amplifying a voltage to be measured with a gain proportional to a ratio between the reference voltage and a breadth of a voltage range within which the voltage to be measured varies;

amplifying the reference voltage with a gain proportional to the ratio between a lower voltage of the voltage range and the breadth of the voltage range;

forming a difference between amplified voltages obtained in the foregoing amplifying steps, and supplying the difference as an input signal to an analog input of the analog/digital converter; and converting the analog signal received at the analog input to a digital signal in the analog/digital converter, and issuing the digital signal as a measurement result at an output of the analog/digital converter.

2. The method according to claim 1, wherein the analog voltage to be measured is affected by a voltage furnished by an electrical supply source subject to possible fluctuations, which further comprises:

supplying the analog/digital converter with a reference voltage proportional to the fluctuating voltage, in such a way as to make the digital signal output by the analog/digital converter independent of the fluctuations in the voltage.

3. A device for digitally measuring an analog voltage which varies within a predetermined voltage range defined between a lower voltage and an upper voltage, comprising:

an analog/digital converter having an analog input, and a reference voltage connected to said analog/digital converter, an amplifier receiving an analog voltage to be measured, said amplifier being connected to reference voltage, said amplifier furnishing to said analog input of said analog/digital converter an output voltage $U_s$ defined by:

$$U_s = \frac{V_{ref}}{U_2 - U_1} \cdot U_e - \frac{U_1}{U_2 - U_1} \cdot V_{ref}$$

where $U_e$ is the voltage to be measured, $U_1$ and $U_2$ are the lower and upper voltages of a voltage range within which the voltage $U_e$ varies, and $V_{ref}$ is the reference voltage.

4. The device according to claim 3, wherein said amplifier includes a differential amplifier having inputs, and means for offsetting a voltage applied to one of said inputs of said differential amplifier.

5. A digital temperature measuring device, comprising:

a thermocouple furnishing an analog output voltage $U_e$ proportional to a temperature to be measured, the analog output voltage $U_e$ varying within a predetermined voltage range defined between a lower voltage $U_1$ and an upper voltage $U_2$;

an amplifier connected to said thermocouple and receiving the analog output voltage $U_e$, said amplifier being connected to a reference voltage $V_{ref}$ and having an output furnishing an output voltage $U_s$ defined by:

$$U_s = \frac{V_{ref}}{U_2 - U_1} \cdot U_e - \frac{U_1}{U_2 - U_1} \cdot V_{ref}$$

and an analog/digital converter connected to the reference voltage $V_{ref}$, said analog/digital converter having an analog input connected to said amplifier and receiving the output voltage $U_s$, and a digital output issuing a digital measurement signal representative of the temperature at said thermocouple.

6. The device according to claim 5, including a reference junction associated with said thermocouple, means for forming an electrical voltage representing a temperature at said reference junction, and a switch cyclically switching said analog input of said analog/digital converter to the electrical voltage such that the digital measurement signal of said analog/digital converter is corrected with regard to the temperature measurement taken by said thermocouple.

7. The device according to claim 6, wherein said means for forming the electrical voltage include a thermistor disposed in such a way as to be sensitive to the temperature of said reference junction, and a resistor bridge formed by said thermistor and a further resistor, said resistor bridge being connected to the reference voltage and having a central tap point at which the electrical voltage is picked up.

8. In combination, an oxygen sensor assembly and a device for digitally measuring an oxygen sensor temperature, the oxygen sensor assembly comprising: an oxygen sensor, an electrical heating resistor supplied by a voltage source and heating said oxygen sensor, a fixed resistor connected to said heating resistor, said heating resistor together with said fixed resistor defining a bridge with a middle point at which an analog measurement voltage $U_e$ is present; and the measuring device comprising: an analog/digital converter having an analog input and a reference potential input receiving a reference voltage, an amplifier connected to the middle point of the bridge and receiving the analog measurement voltage $U_e$, said amplifier furnishing to said analog input of said analog/digital converter an output voltage $U_s$ defined by:

$$U_s = \frac{V_{ref}}{U_2 - U_1} \cdot U_e - \frac{U_1}{U_2 - U_1} \cdot V_{ref}$$

where $U_1$ and $U_2$ are the lower and upper voltages of a voltage range within which the voltage $U_2$ varies, and $V_{ref}$ is the reference voltage.

9. The combination according to claim 8, which further comprises: a motor vehicle battery furnishing a battery voltage, the reference voltage being proportional to the battery voltage.

* * * * *

UNITED STATES PATENT AND TRADEMARK OFFICE
CERTIFICATE OF CORRECTION

PATENT NO. : 5,611,624
DATED : March 18, 1997
INVENTOR(S) : Jean-Marc Tornare

It is certified that error appears in the above-indentified patent and that said Letters Patent is hereby corrected as shown below:

On the title page:

Item (73) should read as follows:

Assignee: Siemens Automotive, S.A.

Signed and Sealed this

Sixteenth Day of June, 1998

Attest:

BRUCE LEHMAN

*Attesting Officer*     *Commissioner of Patents and Trademarks*